United States Patent
Yan et al.

(10) Patent No.: US 12,310,190 B2
(45) Date of Patent: May 20, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jun Yan, Beijing (CN); Xiangdan Dong, Beijing (CN); Fan He, Beijing (CN); Bo Cheng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 667 days.

(21) Appl. No.: 17/286,037

(22) PCT Filed: Sep. 30, 2020

(86) PCT No.: PCT/CN2020/119145
§ 371 (c)(1),
(2) Date: Apr. 16, 2021

(87) PCT Pub. No.: WO2021/088576
PCT Pub. Date: May 14, 2021

(65) Prior Publication Data
US 2021/0399079 A1 Dec. 23, 2021

(30) Foreign Application Priority Data
Nov. 8, 2019 (CN) .......................... 201911088232.6

(51) Int. Cl.
*H10K 59/131* (2023.01)
*H10K 59/40* (2023.01)
*H10K 59/123* (2023.01)

(52) U.S. Cl.
CPC ........... *H10K 59/131* (2023.02); *H10K 59/40* (2023.02); *H10K 59/123* (2023.02)

(58) Field of Classification Search
CPC .... H10K 59/131; H10K 59/12; H10K 50/805; H10K 59/805; H10K 59/123; H10K 59/40; H10K 71/621
See application file for complete search history.

(56) References Cited

U.S. PATENT DOCUMENTS

| 2005/0023956 A1 | 2/2005 | Kwak et al. |
| 2007/0200842 A1 | 8/2007 | Takuda et al. |

(Continued)

FOREIGN PATENT DOCUMENTS

| CN | 101030354 A | 9/2007 |
| CN | 108321182 A | 7/2018 |

(Continued)

OTHER PUBLICATIONS

JP 2021-564585, Notice of Reasons for Refusal, Jul. 19, 2024.

*Primary Examiner* — Ratisha Mehta
*Assistant Examiner* — Brad A Knudson
(74) *Attorney, Agent, or Firm* — The Webb Law Firm

(57) ABSTRACT

The present disclosure provides a display substrate and a display device. The display substrate includes: a base substrate including a display area and a peripheral area; a plurality of sub-pixels, wherein the sub-pixel includes: a light emitting element including a first electrode, a light emitting layer and a second electrode; a plurality of first power supply lines; a first power bus; and a second power supply line including a first portion surrounding a second boundary, a third boundary and a fourth boundary of the display area, and a second portion on a side of the first power bus away from the display area. There is a gap between the first power bus and the second portion. An orthographic projection of the gap on the base substrate at least partially (Continued)

overlaps with an orthographic projection of the second electrode on the base substrate.

18 Claims, 5 Drawing Sheets

(56) References Cited

U.S. PATENT DOCUMENTS

| | | | |
|---|---|---|---|
| 2017/0365808 A1 | 12/2017 | Lee et al. | |
| 2019/0043938 A1* | 2/2019 | Lee | H10K 59/123 |
| 2019/0081129 A1 | 3/2019 | Sung et al. | |
| 2019/0229177 A1 | 7/2019 | Kim et al. | |
| 2019/0237533 A1* | 8/2019 | Kim | G06F 3/0412 |
| 2019/0305072 A1* | 10/2019 | Park | H10K 59/124 |
| 2019/0319076 A1* | 10/2019 | Lee | H10K 50/844 |
| 2019/0341439 A1* | 11/2019 | Choi | H10K 59/122 |

FOREIGN PATENT DOCUMENTS

| | | |
|---|---|---|
| CN | 110690365 A | 1/2020 |
| CN | 210429887 U | 4/2020 |
| EP | 3258496 A1 | 12/2017 |
| EP | 3522229 A1 | 8/2019 |
| EP | 3745460 A1 | 12/2020 |
| JP | 2005049808 A | 2/2005 |
| JP | 2019053292 A | 4/2019 |
| KR | 1020180129718 A | 12/2018 |

* cited by examiner

DISPLAY SUBSTRATE AND DISPLAY DEVICE

CROSS-REFERENCE TO RELATED APPLICATIONS

The present application is a U.S. National Stage Application under 35 U.S.C. § 371 of International Patent Application No. PCT/CN2020/119145, filed on Sep. 30, 2020, which claims priority to China Patent Application No. 201911088232.6 filed on Nov. 8, 2019, the disclosure of both of which are incorporated by reference herein in their entirety.

TECHNICAL FIELD

The present disclosure relates to a display substrate and a display device.

BACKGROUND

With the rapid development of AMOLED (Active Matrix Organic Light Emitting Diode), the development of smart terminals such as cell phones has entered the era of a full screen and a narrow edge. In order to provide the user with a better user experience, features such as a full screen, a narrow edge, a high resolution, a rolled wear and/or folding will become an important development direction for AMOLED in the future.

In the related art, in order to make the display panel lighter and thinner to adapt to future folded and rolled products, touch technology has been developed. For example, the touch technology may be FMLOC (Flexible Multi Layer On Cell) technology.

SUMMARY

According to an aspect of embodiments of the present disclosure, a display substrate is provided. The display substrate comprises: a base substrate comprising a display area and a peripheral area surrounding the display area, wherein the display area comprises a first boundary, a second boundary, a third boundary, and a fourth boundary; a plurality of sub-pixels in the display area, wherein at least one of the plurality of sub-pixels comprises a light emitting element, and the light emitting element comprises a first electrode on the base substrate, a light emitting layer on a side of the first electrode away from the base substrate and a second electrode on a side of the light emitting layer away from the base substrate; a plurality of first power supply lines in the display area and electrically connected to first electrodes of the plurality of sub-pixels; a first power bus in a part of the peripheral area on a side of the first boundary away from the display area and electrically connected to the plurality of first power supply lines; and a second power supply line in the peripheral area and electrically connected to the second electrode, wherein the second power supply line comprises a first portion and a second portion, the first portion surrounding the second boundary, the third boundary and the fourth boundary of the display area, and the second portion being on a side of the first power bus away from the display area; wherein there is a gap between the first power bus and the second portion of the second power supply line, and an orthographic projection of the gap on the base substrate at least partially overlaps with an orthographic projection of the second electrode on the base substrate.

In some embodiments, the second portion comprises a first sub-portion and a second sub-portion spaced apart from and opposite to the first sub-portion; and there is a first gap between the first sub-portion and the first power bus, there is a second gap between the second sub-portion and the first power bus, and an orthographic projection of at least one of the first gap or the second gap on the base substrate at least partially overlaps with the orthographic projection of the second electrode on the base substrate.

In some embodiments, the first sub-portion is close to the second boundary, and the second sub-portion is close to the fourth boundary.

In some embodiments, orthographic projections of the first gap and the second gap on the base substrate are inside the orthographic projection of the second electrode on the base substrate.

In some embodiments, the display substrate further comprises a plurality of touch electrode lines in the peripheral area, wherein orthographic projections of the plurality of touch electrode lines on the base substrate at least partially overlap with the orthographic projection of the gap on the base substrate.

In some embodiments, the plurality of touch electrode lines comprise a plurality of first touch electrode lines and a plurality of second touch electrode lines, the plurality of first touch electrode lines surrounding the second boundary, the third boundary and a part of the first boundary of the display area, and the plurality of second touch electrode lines surrounding the fourth boundary and another part of the first boundary of the display area.

In some embodiments, the plurality of first touch electrode lines are signal transmission lines, and the plurality of second touch electrode lines are signal receiving lines.

In some embodiments, the display substrate further comprises a flexible circuit board electrically connected to the plurality of touch electrode lines, the first power bus and the second power supply line and configured to provide electrical signals to the plurality of touch electrode lines, the first power bus and the second power supply line.

In some embodiments, the first power bus is configured to receive a first voltage signal; the second power supply line is configured to receive a second voltage signal; wherein the first voltage signal is higher than the second voltage signal.

In some embodiments, the at least one of the plurality of sub-pixels further comprises a thin film transistor and a connection electrode, the thin film transistor comprising an active layer on the base substrate, a gate on a side of the active layer away from the base substrate, and a source and a drain on a side of the gate away from the base substrate, the connection electrode being on a side of the thin film transistor away from the base substrate, the source or the drain being electrically connected to the connection electrode, and the connection electrode being electrically connected to the first electrode.

In some embodiments, the first power bus comprises a first sub-electrode and a second sub-electrode, wherein an orthographic projection of the first sub-electrode on the base substrate at least partially overlaps with an orthographic projection of the second sub-electrode on the base substrate, the first sub-electrode is in the same layer as the source or the drain, and the second sub-electrode is in the same layer as the connection electrode.

In some embodiments, the first portion comprises a first conductive portion, a second conductive portion, and a third conductive portion, the second conductive portion being on a side of the first conductive portion away from the base substrate, the third conductive portion being on a side of the second conductive portion away from the base substrate, the first conductive portion, the second conductive portion and the third conductive portion being electrically connected, the first conductive portion being in the same layer as the source or the drain, the second conductive portion being in the same layer as the connection electrode, and the third conductive portion being in the same layer as the first electrode.

In some embodiments, the second portion comprises a fourth conductive portion, the fourth conductive portion being in the same layer as the source or the drain, and the fourth conductive portion being a structural layer formed integrally with the first conductive portion.

In some embodiments, the display substrate further comprises a protective layer covering the second power supply line, wherein at least a part of the protective layer is between the second power supply line and the second electrode.

In some embodiments, the display substrate further comprises: a buffer layer on the base substrate; a first insulating layer on a side of the buffer layer away from the base substrate; and a plurality of first signal lines and a plurality of second signal lines on a side of the first insulating layer away from the base substrate, wherein orthographic projections of the plurality of first signal lines on the base substrate are alternately arranged with orthographic projections of the plurality of second signal lines on the base substrate, the plurality of first signal lines are arranged in different layers from the plurality of second signal lines, and orthographic projections of a part of the plurality of first signal lines and a part of the plurality of second signal lines on the base substrate at least partially overlap with the orthographic projection of the gap on the base substrate.

In some embodiments, the display substrate further comprises: a second insulating layer between the plurality of first signal lines and the plurality of second signal lines; and an interlayer dielectric layer covering the plurality of second signal lines; wherein the second insulating layer and the interlayer dielectric layer are between the gate and the source or the drain.

In some embodiments, the display substrate further comprises a capacitor between the interlayer dielectric layer and the base substrate, the capacitor comprising a first capacitor electrode on a side of the first insulating layer away from the base substrate and a second capacitor electrode on a side of the second insulating layer away from the first capacitor electrode, the first capacitor electrode being in the same layer as the gate and being isolated from the gate, and the second capacitor electrode being in the same layer as the plurality of second signal lines.

In some embodiments, the display substrate further comprises a second planarization layer between the first power bus and the second electrode; and a pixel defining layer between the second planarization layer and the second electrode.

In some embodiments, the display substrate further comprises a first planarization layer between the gap and the second electrode, the first planarization layer covering the protective layer, wherein the second planarization layer, the pixel defining layer, and a part of the protective layer are also between the gap and the second electrode, and the second planarization layer covers the first planarization layer.

According to another aspect of embodiments of the present disclosure, a display device is provided. The display device comprises the display substrate as described previously.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
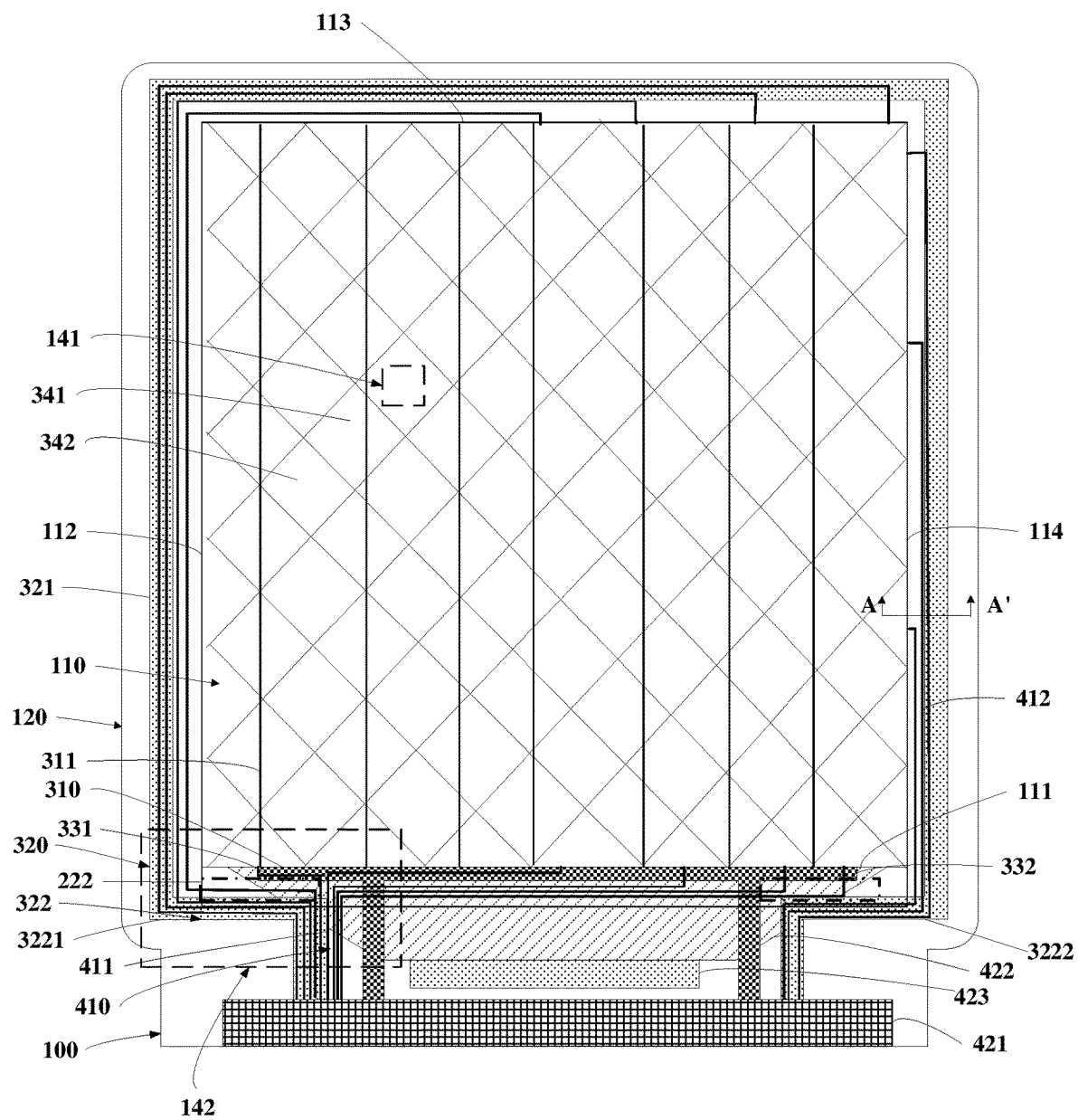
FIG. 1 is a top view showing a display substrate according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

FMLOC (Flexible Multi Layer On Cell) technology is a touch technology. In the FMLOC technology, touch electrodes are fabricated on an encapsulation layer. In the FMLOC technology, in order to prevent signal crosstalk between the touch electrode lines and other traces on the backplane, the touch electrode lines may be signal shielded by a common grounding line. However, the inventors of the present disclosure have found that in the related art, there is a gap between the power voltage line and the common grounding line at a corner area of the display substrate. Apart of the touch electrode line is above the gap, and there are other signal lines (for example, data lines and/or GOA (Gate Driver on Array, also that is, a gate driving circuit) signal lines) or the like below the gap. The signals in the touch electrode line, the data line, and the GOA signal line may all be alternating current signals. There is a parasitic capacitor between the touch electrode line and the data line or the GOA signal line. Signal variation in one of these signal lines may affect a signal in another signal line. Therefore, there may be signal interference between the touch electrode line and the data line or the GOA signal line, thereby resulting in poor display or poor touch.

In view of this, the embodiments of the present disclosure provide a display substrate to reduce the signal interference. The structure of the display substrate according to an embodiment of the present disclosure will be described in detail below in conjunction with the accompanying drawings.

Figure 2:
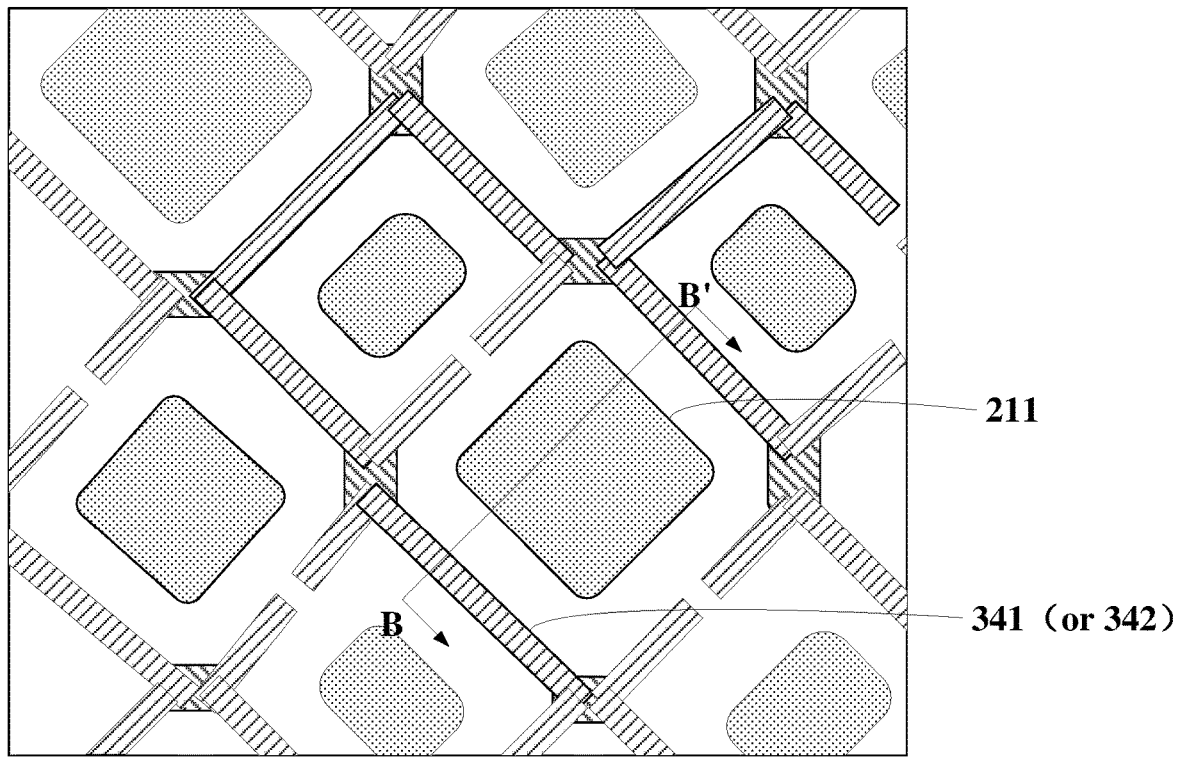
FIG. 2 is an enlarged schematic view showing a partial structure within a first dashed box 141 in FIG. 1.
Figure 7:
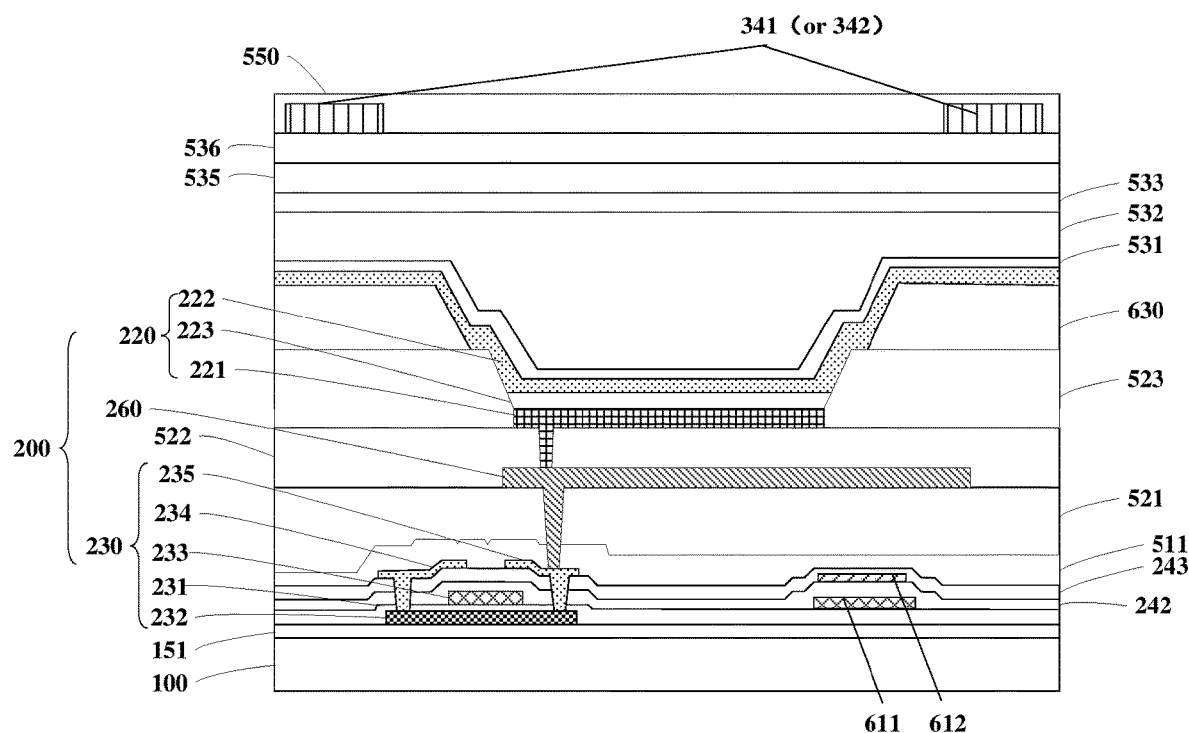
FIG. 7 is a schematic cross-sectional view showing a structure taken along the line B-B' in FIG. 2.

FIG. 1 is a top view showing the display substrate according to an embodiment of the present disclosure. FIG. 2 is an enlarged schematic view showing a partial structure within a first dashed box 141 in FIG. 1. FIG. 7 is a schematic cross-sectional view showing a structure taken along the line B-B' in FIG. 2. The display substrate will be described in detail below in conjunction with FIGS. 1, 2 and 7.

As shown in FIGS. 1, 2 and 7, the display substrate comprises a base substrate 100, a plurality of sub-pixels 200, a plurality of first power supply lines 311, a first power bus 310 and a second power supply line 320.

The base substrate 100 comprises a display area 110 and a peripheral area 120 surrounding the display area 110. The display area 110 comprises a first boundary 111, a second boundary 112, a third boundary 113, and a fourth boundary 114. Here, the first boundary 111 is opposite to the third boundary 113, and the second boundary 112 is opposite to the fourth boundary 114.

The plurality of sub-pixels 200 are in the display area 110. At least one of the plurality of sub-pixels 200 comprises a light emitting element 220, as shown in FIG. 7. The light emitting element 220 comprises a first electrode 221 on the base substrate 100, alight emitting layer 223 on a side of the first electrode 221 away from the base substrate 100, and a second electrode 222 on a side of the light emitting layer 223 away from the base substrate 100. For example, the first electrode 221 is an anode, and the second electrode 222 is a cathode. For example, the second electrode 222 receives a common grounding terminal voltage signal Vss.

It should be noted that, in embodiments of the present disclosure, when it is described that one structure is on another structure, the one structure may be in direct contact with the another structure, or may not be in direct contact with the another structure. For example, when it is described that the first electrode 221 is on the base substrate 100, the first electrode 221 may be above the base substrate 100 without directly contact with the base substrate.

As shown in FIG. 1, the plurality of first power supply lines 311 are in the display area 110. The plurality of first power supply lines 311 are electrically connected to the first electrodes 221 of the plurality of sub-pixels. It should be noted that when it is described that a specific device is electrically connected to another device, the specific device may be directly electrically connected to the another device without an intermediate device, or may not be directly electrically connected to the another device but with an intermediate device. For example, the first power supply lines 311 may be electrically connected to the first electrode 221 of a sub-pixel through several thin film transistors.

As shown in FIG. 1, the first power bus 310 is in a part of the peripheral area 120 on a side of the first boundary 111 away from the display area 110. The first boundary 111 is closer to the first power bus 310 than other boundaries of the display area. The first power bus 310 is electrically connected to the plurality of first power supply lines 311.

The second power supply line 320 is in the peripheral area 120 and electrically connected to the second electrode 222. The second power supply line 320 comprises a first portion 321 and a second portion 322. The first portion 321 surrounds the second boundary 112, the third boundary 113 and the fourth boundary 114 of the display area 110. The second portion 322 is on a side of the first power bus 310 away from the display area 110.

In some embodiments, the first power bus 310 is configured to receive a first voltage signal, and the second power supply line 320 is configured to receive a second voltage signal. The first voltage signal is higher than the second voltage signal. For example, the first power bus is configured to receive the power voltage signal Vdd, and the second power supply line is configured to receive the common grounding terminal voltage signal Vss.

There is a gap 331 or 332 between the first power bus 310 and the second portion 322 of the second power supply line 320. An orthographic projection of the gap 331 or 332 on the base substrate 100 at least partially overlaps with an orthographic projection of the second electrode 222 on the base substrate 100.

So far, a display substrate according to some embodiments of the present disclosure is provided. In the display substrate, the base substrate comprises a display area and a peripheral area surrounding the display area. A plurality of sub-pixels are in the display area. At least one of the plurality of sub-pixels comprises a light emitting element. The light emitting element comprises a first electrode on the base substrate, a light emitting layer on a side of the first electrode away from the base substrate, and a second electrode located on a side of the light emitting layer away from the base substrate. A plurality of first power supply lines are in the display area and electrically connected to the first electrodes of the plurality of sub-pixels. A first power bus is in a part of the peripheral area on a side of the first boundary away from the display area. The first power bus is electrically connected to the plurality of first power supply lines. The second power supply line is in the peripheral area and electrically connected to the second electrode. The second power supply line comprises a first portion and a second portion. The first portion surrounds a second boundary, a third boundary, and a fourth boundary of the display area. The second portion is on a side of the first power bus away from the display area. A gap is between the first power bus and the second portion of the second power supply line. An orthographic projection of the gap on the base substrate at least partially overlaps with an orthographic projection of the second electrode of the light emitting element on the base substrate. That is, the second electrode of the light emitting element covers the gap. In this way, the second electrode of the light emitting element may produce a signal shielding effect, thereby reducing the signal interference between the signal line above the gap and the signal line below the gap, and improving the display effect of the display substrate.

In some embodiments, as shown in FIG. 1, the second portion 322 of the second power supply line 320 comprises a first sub-portion 3221 and a second sub-portion 3222 spaced apart from and opposite to the first sub-portion 3221. For example, the first sub-portion 3221 is close to the second boundary 112, and the second sub-portion 3222 is close to the fourth boundary 114. There is a first gap 331 between the first sub-portion 3221 and the first power bus 310. There is a second gap 332 between the second sub-portion 3222 and the first power bus 310. An orthographic projection of at least one of the first gap 331 or the second gap 332 on the base substrate 100 at least partially overlaps with the orthographic projection of the second electrode 222 on the base substrate 100.

In some embodiments, orthographic projections of the first gap 331 and the second gap 332 on the base substrate 100 are inside the orthographic projection of the second electrode 222 on the base substrate 100. In this way, the second electrode may completely cover the two gaps, thereby further reducing the signal interference between different signal lines, and improving the display effect of the display substrate.

In some embodiments, as shown in FIG. 1, the display substrate further comprises a plurality of touch electrode lines 410 in the peripheral area 120. Orthographic projections of the plurality of touch electrode lines 410 on the base substrate 100 at least partially overlap with the orthographic projection of the gap 331 or 332 on the base substrate 100. Therefore, the touch electrode line 410 might interfere with other signal lines in a case where the second electrode 222 of the light emitting element does not cover the gap 331 or 332. It may be seen from here that the above-described second electrode may produce a good signal shielding effect.

In some embodiments, as shown in FIG. 1, the plurality of touch electrode lines 410 comprise a plurality of first touch electrode lines 411 and a plurality of second touch electrode lines 412. The first touch electrode line 411 surrounds the second boundary 112, the third boundary 113 and a part of the first boundary 111 of the display area 110. The second touch electrode line 412 surrounds the fourth boundary 114 and another part of the first boundary 111 of the display area 110. For example, the first touch electrode line 411 is a signal transmission line, and the second touch electrode line 412 is a signal receiving line; or the first touch electrode line 411 is a signal receiving line, and the second touch electrode line 412 is a signal transmission line.

In some embodiments, as shown in FIG. 1, the display substrate further comprises a flexible circuit board 421 electrically connected to the plurality of touch electrode lines 410, the first power bus 310 and the second power supply line 320. The flexible circuit board 421 is configured to provide electrical signals to the plurality of touch electrode lines 410, the first power bus 310, and the second power supply line 320.

In some embodiments, as shown in FIG. 1, the display substrate further comprises a signal connection area 422 and an integrated circuit area 423. The integrated circuit area 423 is electrically connected to the display area 110 through the signal connection area 422. A plurality of data line leads are in the signal connection area 422.

In some embodiments, as shown in FIGS. 1 and 2, the display substrate further comprises a first touch electrode 341 and a second touch electrode 342 in the display area. The first touch electrode 341 is electrically connected to the first touch electrode line 411, and the second touch electrode 342 is electrically connected to the second touch electrode line 412. As shown in FIG. 2, a touch signal of the first touch electrode 341 is different from a touch signal of the second touch electrode 342. In addition, FIG. 2 also shows an opening 211 of the sub-pixel.

Figure 3:
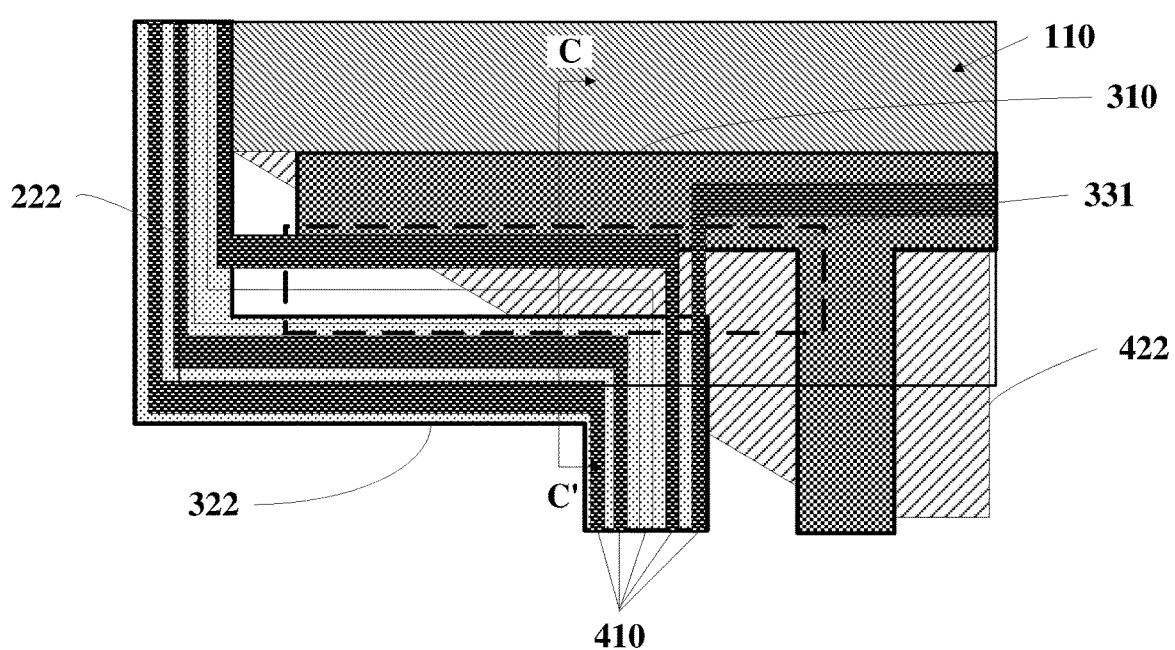
FIG. 3 is an enlarged schematic view showing a partial structure within a second dashed box 142 in FIG. 1.
Figure 4:
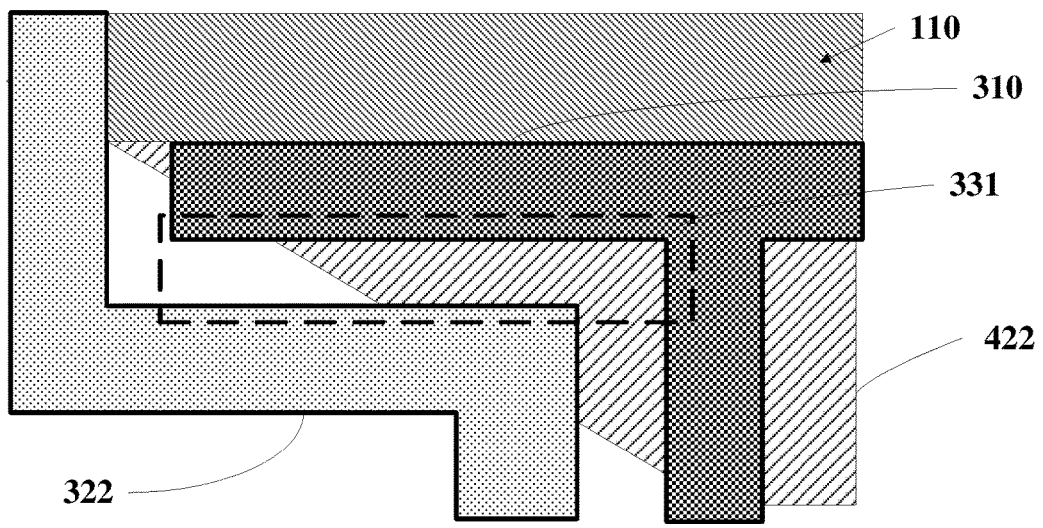
FIG. 4 is a top view showing the structure in FIG. 3 after the touch electrode line 410 and the second electrode 222 are omitted.
Figure 5:
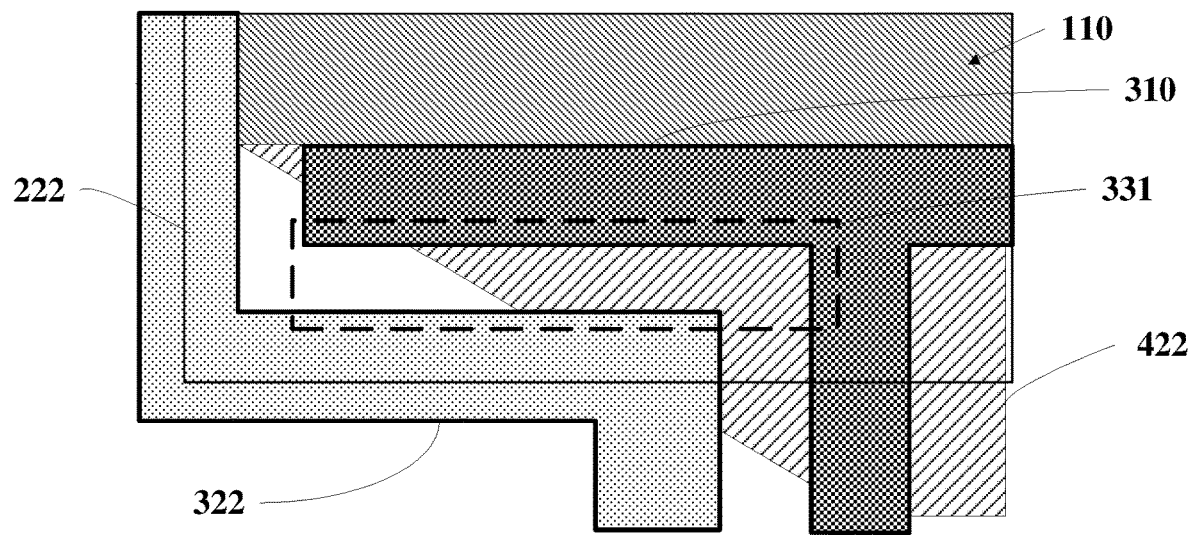
FIG. 5 is a top view showing the structure in FIG. 4 after the second electrode 222 is added.

FIG. 3 is an enlarged schematic view showing a partial structure within a second dashed box 142 in FIG. 1. FIG. 4 is a top view showing the structure in FIG. 3 after the touch electrode line 410 and the second electrode 222 are omitted. The structure of FIG. 4 omits the touch electrode line 410 and the second electrode 222 to show the gap 331 (as shown by the dashed box in FIG. 4) more clearly. FIG. 5 is a top view showing the structure in FIG. 4 after the second electrode 222 is added.

As shown in FIGS. 3, 4 and 5, there is a gap (for example, a first gap) 331 between the first power bus 310 and the second portion 322 of the second power supply line 320. The orthographic projection of the first gap 331 on the base substrate 100 at least partially overlaps with the orthographic projection of the second electrode 222 on the base substrate 100. In this way, it is possible to reduce the signal interference between the touch electrode line 410 and other signal lines (not shown in FIGS. 3 to 5).

In some embodiments, it is possible to ensure that the second electrode is located above the gap in consideration of the alignment accuracy and the shadow effect of the second electrode. For example, considering that the size range of the alignment accuracy and the shadow structure may be −80 μm to −60 μm, or 60 μm to 80 μm, the second electrode may be made to exceed the gap by 60 μm to 80 μm after covering the gap. Of course, those skilled in the art should understand that the designed size range of the second electrode here is only exemplary, and the scope of the embodiments of the present disclosure is not limited to this.

In some embodiments, the above-described second electrode may be a whole-layer structure. In other embodiments, the above-described second electrode may have a layer structure arranged in blocks. For example, these blocks of the second electrode may be supplied with cathode signals respectively.

Figure 6:
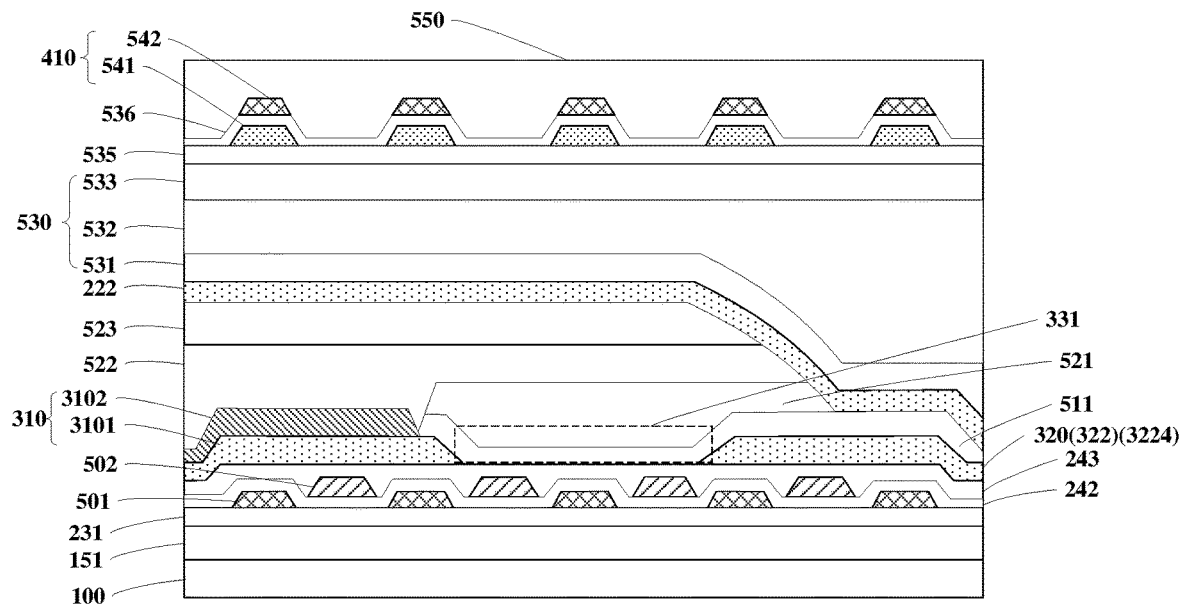
FIG. 6 is a schematic cross-sectional view showing a structure taken along the line C-C' in FIG. 3.

FIG. 6 is a schematic cross-sectional view showing a structure taken along the line C-C' in FIG. 3. Here, a partial structure of the display substrate will be described from the perspective of a cross-sectional view.

As shown in FIG. 6, the display substrate comprises a base substrate 100, a buffer layer 151 on the base substrate 100, and a first insulating layer 231 on a side of the buffer layer 151 away from the base substrate 100. For example, a material of the first insulating layer 231 comprises silicon dioxide, silicon nitride, or the like.

As shown in FIG. 6, the display substrate further comprises a plurality of first signal lines 501 and a plurality of second signal lines 502 on a side of the first insulating layer 231 away from the base substrate 100. For example, the first signal lines 501 and the second signal lines 502 are data signal lines. Orthographic projections of the plurality of first signal lines 501 on the base substrate 100 are alternately arranged with the orthographic projections of the plurality of second signal lines 502 on the base substrate 100. The plurality of first signal lines 501 are arranged in different layers from the plurality of second signal lines 502. In this way, the signal lines 501 and 502 are arranged to save space.

Since the orthographic projections of apart of the plurality of first signal lines 501 and apart of the plurality of second signal lines 502 on the base substrate at least partially overlap with the orthographic projection of the gap 331 or 332 on the base substrate, the above-described second electrode 222 may reduce the signal interference between the signal line 501 or 502 and the touch electrode line 410.

As shown in FIG. 6, the display substrate further comprises a second insulating layer 242 between the plurality of first signal lines 501 and the plurality of second signal lines 502. For example, a material of the second insulating layer 242 comprises silicon dioxide, silicon nitride, or the like.

As shown in FIG. 6, the display substrate further comprises an interlayer dielectric layer 243 covering the plurality of second signal lines 502. The first power bus 310 and the second power supply line 320 are on a side of the interlayer dielectric layer 243 away from the base substrate 100.

In some embodiments, as shown in FIG. 6, the first power bus 310 comprises a first sub-electrode 3101 and a second sub-electrode 3102. An orthographic projection of the first sub-electrode 3101 on the base substrate 100 at least partially overlaps with an orthographic projection of the second sub-electrode 3102 on the base substrate 100. For example, the first sub-electrode 3101 is in the same layer as a source or a drain (described later) of a thin film transistor of the sub-pixel, and the second sub-electrode 3102 is in the same layer as a connection electrode (described later).

It should be noted that the "same layer" refers to a layer structure formed by using the same film forming process to form a film layer for forming a specific pattern, and then using the same mask to pattern the film layer through a single patterning process. According to different specific patterns, a single patterning process may comprise multiple exposure, development, or etching processes, and the specific pattern in the formed layer structure may be continuous or discontinuous. These specific patterns might also be at different heights or have different thicknesses.

In some embodiments, as shown in FIG. 6, the second portion 322 of the second power supply line 320 comprises a fourth conductive portion 3224. The fourth conductive portion 3224 is in the same layer as the source or the drain of the thin film transistor. The fourth conductive portion 3224 is a structural layer formed integrally with a first conductive portion (described later) of the first portion. That is, the second portion 322 of the second power supply line 320 shown in FIG. 6 may serve as the fourth conductive portion 3224, and the fourth conductive portion 3224 is in the same layer as the source or the drain of the thin film transistor. As shown in FIG. 6, there is a gap 331 (or gap 332) between the second power supply line 320 and the first power bus 310.

In some embodiments, as shown in FIG. 6, the display substrate further comprises a protective layer 511 covering the second power supply line 320. At least apart of the protective layer 511 is between the second power supply line 320 and the second electrode 222. For example, a material of the protective layer 511 comprises an insulating material (for example, silicon nitride or the like). The protective layer 511 comprises an inorganic protective layer or an organic protective layer.

The protective layer is arranged between the second power supply line 320 and the second electrode 222, so that the second power supply line 320 may not be in direct contact with the second electrode 222 at a position of the peripheral area. Since hydrophilicity of the protective layer is less than hydrophilicity of the second power supply line, it is possible to prevent water vapor from invading the second power supply line resulting from fragmentation of a shadow structure of the second electrode (such as the cathode) (here, the second electrode may form the shadow structure in an edge area of an area blocked by the mask during evaporation), and further preventing water vapor from invading the display area through a water and oxygen channel formed on one side of the second power supply line. In this way, it is possible to prevent failure of the organic material in the display area due to water vapor, and further prevent the display failure of the display substrate.

In some embodiments, as shown in FIG. 6, the display substrate further comprises a first planarization layer 521 covering the protective layer 511, and a second planarization layer 522 covering the first power bus 310 and the first planarization layer 521. For example, materials of the first planarization layer 521 and the second planarization layer 522 comprise insulating materials (for example, organic insulating materials such as polyimide). The display substrate further comprises a pixel defining layer 523 on a side of the second planarization layer 522 away from the base substrate 100. As shown in FIG. 6, the above-described second electrode 222 covers the pixel defining layer 523, the second planarization layer 522, the first planarization layer 521 and the protective layer 511.

In some embodiments, as shown in FIG. 6, the display substrate further comprises an encapsulation layer 530 on a side of the second electrode 222 away from the base substrate 100. For example, the encapsulation layer 530 comprises: a first inorganic encapsulation layer 531 on a side of the second electrode 222 away from the base substrate 100; an organic encapsulation layer 532 on a side of the first inorganic encapsulation layer 531 away from the base substrate 100; and a second inorganic encapsulation layer 533 on a side of the organic encapsulation layer 532 away from the base substrate 100. For example, a material of the first inorganic encapsulation layer 531 comprises silicon nitride or the like, a material of the organic encapsulation layer 532 comprises PMMA (poly(methyl methacrylate), also known as acrylic) or the like, and a material of the second inorganic encapsulation layer 533 comprises silicon nitride or the like.

For example, the first inorganic encapsulation layer 531 is formed on the second electrode 222 through a CVD (Chemical Vapor Deposition) process, and then the organic encapsulation layer 532 is formed on the first inorganic encapsulation layer 531 through an inkjet printing process. After that, the second inorganic encapsulation layer 533 is formed on the organic encapsulation layer 532 through the CVD process.

In some embodiments, as shown in FIG. 6, the display substrate further comprises a barrier layer 535 on a side of the encapsulation layer 530 away from the base substrate 100. For example, a material of the barrier layer 535 comprises an inorganic insulating material.

As shown in FIG. 6, the plurality of touch electrode lines 410 are on a side of the barrier layer 535 away from the base substrate 100. In some embodiments, as shown in FIG. 6, each touch electrode line 410 comprises a first wire 541 on the barrier layer 535 and a second wire 542 on a side of the first wire 541 away from the barrier layer 535. For example, the first wire 541 comprises a Ti/Al/Ti (titanium/aluminum/titanium) three-layer structure, and the second wire 542 comprises a Ti/Al/Ti (titanium/aluminum/titanium) three-layer structure.

As shown in FIG. 6, the display substrate further comprises a third insulating layer 536 between the first wire 541 and the second wire 542. For example, a material of the third insulating layer 536 comprises silicon nitride, silicon oxide, or silicon oxynitride. In each touch electrode line 410, the first wire 541 is electrically connected to the second wire 542 through a first conductive via hole (it is not shown in FIG. 6 but may be seen in FIG. 8), which may reduce the resistances of the plurality of touch electrode lines 410.

In some embodiments, as shown in FIG. 6, the display substrate further comprises a covering layer 550 covering the plurality of touch electrode lines 410. For example, a material of the covering layer 550 comprises an organic insulating material or an inorganic insulating material.

FIG. 7 is a schematic cross-sectional view showing a structure taken along the line B-B' in FIG. 2;

As shown in FIG. 7, at least one of the plurality of sub-pixels 200 comprises a thin film transistor 230 and a connection electrode 260 in addition to the light emitting element 220.

The thin film transistor 230 comprises an active layer 232 on the base substrate 100, a gate 233 on a side of the active layer 232 away from the base substrate 100, and a source 234 and a drain 235 on a side of the gate 233 away from the base substrate 100. For example, the active layer 232 is on the buffer layer 151. The first insulating layer 231 is between the active layer 232 and the gate 233. The second insulating layer 242 and the interlayer dielectric layer 243 are between the gate and the source 234/drain 235. The source 234 is electrically connected to the active layer 232 through a second conductive via hole. The second conductive via hole passes through the interlayer dielectric layer 243, the second insulating layer 242, and the first insulating layer 231. The drain 235 is electrically connected to the active layer 232 through a third conductive via hole. The third conductive via hole passes through the interlayer dielectric layer 243, the second insulating layer 242, and the first insulating layer 231.

As shown in FIG. 7, the connection electrode 260 is on a side of the thin film transistor 230 away from the base substrate 100. The source 234 or the drain 235 is electrically connected to the connection electrode 260. The connection electrode 260 is electrically connected to the first electrode 221. For example, the connection electrode is electrically connected to the drain 235 through a fourth conductive via hole. The fourth conductive via hole passes through the first planarization layer 521 and the protective layer 511. The first electrode 221 is electrically connected to the connection electrode 260 through a fifth conductive via hole. The fifth conductive via hole passes through the second planarization layer 522.

In some embodiments, as shown in FIG. 7, the display substrate further comprises a capacitor between the interlayer dielectric layer 243 and the base substrate 100. The capacitor comprises a first capacitor electrode 611 on a side of the first insulating layer 231 away from the base substrate 100 and a second capacitor electrode 612 on a side of the second insulating layer 242 away from the first capacitor electrode 611. The first capacitor electrode 611 is in the same layer as the gate 233 and isolated from the gate 233. The second capacitor electrode 612 is in the same layer as the second signal line 502, and prepared by the same patterning process as the second signal line. The second insulating layer 242 covers the first capacitor electrode 611, and the interlayer dielectric layer 243 covers the second capacitor electrode 612.

Here, the same patterning process refers to using the same film forming process to form a film layer for forming a specific pattern, and then using the same mask to form a layer structure through a single patterning process. It should be noted that, according to different specific patterns, a single patterning process may comprise multiple exposure, development or etching processes, and the specific pattern in the formed layer structure may be continuous or discontinuous. These specific patterns might also be at different heights or have different thicknesses.

In some embodiments, as shown in FIG. 7, the display substrate further comprises a spacer layer 630 on a side of the pixel defining layer 523 away from the base substrate 100. The second electrode 222 covers the spacer layer 630. For example, a material of the spacer layer 630 comprises an inorganic insulating material or an organic insulating material.

In some embodiments, as shown in FIG. 7, the first touch electrode 341 and the second touch electrode 342 are on a side of the third insulating layer 536 away from the base substrate 100. The covering layer 550 covers the first touch electrode 341 and the second touch electrode 342.

Figure 8:
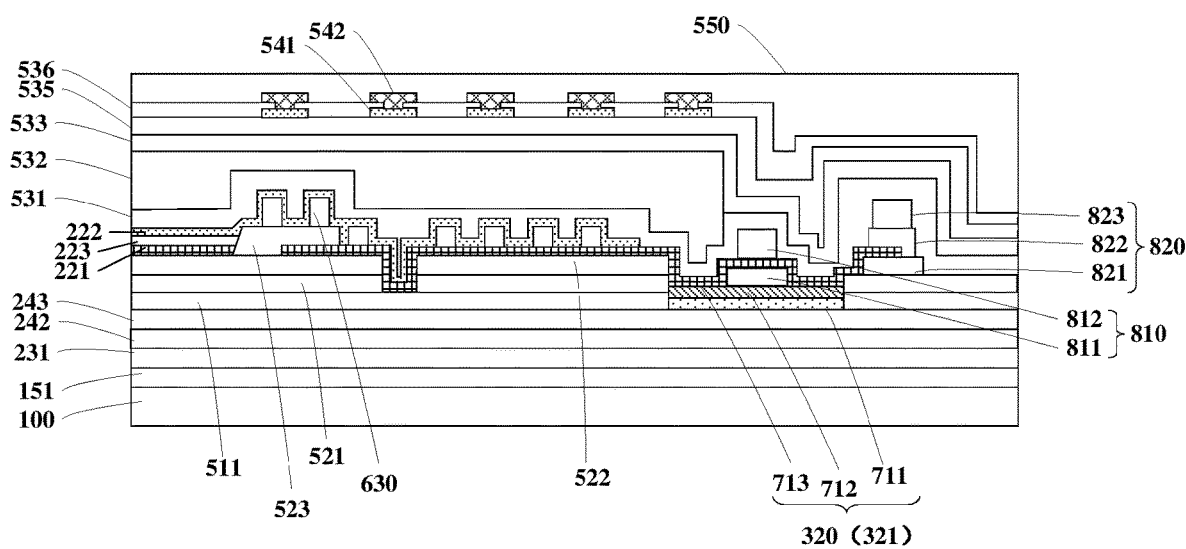
FIG. 8 is a schematic cross-sectional view showing a structure taken along the line A-A' in FIG. 1.

FIG. 8 is a schematic cross-sectional view showing a structure taken along the line A-A' in FIG. 1.

In some embodiments, as shown in FIG. 8, the first portion 321 of the second power supply line 320 comprises a first conductive portion 711, a second conductive portion 712 and a third conductive portion 713. The second conductive portion 712 is on a side of the first conductive portion 711 away from the base substrate 100. The third conductive portion 713 is on a side of the second conductive portion 712 away from the base substrate 100. The first conductive portion 711, the second conductive portion 712, and the third conductive portion 713 are electrically connected. The first conductive portion 711 is in the same layer as the source 234 or the drain 235. The second conductive portion 712 is in the same layer as the connection electrode 260. The third conductive portion 713 is in the same layer as the first electrode 221. The first conductive portion 711 of the first portion 321 and the fourth conductive portion of the second portion 322 of the second power supply line 320 are integrated as a structure layer. A material of the first conductive portion 711 is the same as a material of the source 234 or the drain 235, and formed by the same patterning process as the source and the drain. A material of the second conductive portion 712 is the same as a material of the connection electrode 260, and formed by the same patterning process as the connection electrode. A material of the third conductive portion 713 is the same as a material of the first electrode 221, and formed by the same patterning process as the first electrode 221. As shown in FIG. 8, the third conductive portion 713 is electrically connected to the second electrode 222.

In some embodiments, as shown in FIG. 8, the display substrate further comprises a first dam 810. The first dam 810 may comprise a portion 811 located in the same layer as the second planarization layer 522 and a portion 812 located in the same layer as the pixel defining layer 523. The display substrate may further comprise a second dam 820. The second dam 820 may comprise a portion 821 located in the same layer as the second planarization layer 522, a portion 822 located in the same layer as the pixel defining layer 523, and a portion 823 located in the same layer as the spacer layer 630.

In addition, as shown in FIG. 8, the first wire 541 is electrically connected to the second wire 542 through the first conductive via hole.

So far, the display substrate according to some embodiments of the present disclosure has been described in detail.

In some embodiments of the present disclosure, a display device is also provided. The display device comprises the display substrate (e.g., the display substrate shown in FIG. 1) as described above. For example, the display device may be any product or member having a display function, such as a display panel, a mobile phone, a tablet computer, a television, a display, a notebook computer, a digital photo frame, a navigator, or the like.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display substrate, comprising:
  a base substrate comprising a display area and a peripheral area surrounding the display area, wherein the display area comprises a first boundary, a second boundary, a third boundary, and a fourth boundary;
  a plurality of sub-pixels in the display area, wherein at least one of the plurality of sub-pixels comprises a light emitting element, and the light emitting element comprises a first electrode on the base substrate, a light emitting layer on a side of the first electrode away from the base substrate and a second electrode on a side of the light emitting layer away from the base substrate;
  a plurality of first power supply lines in the display area and electrically connected to first electrodes of the plurality of sub-pixels;
  a first power bus in a part of the peripheral area on a side of the first boundary away from the display area and electrically connected to the plurality of first power supply lines;
  a second power supply line in the peripheral area and electrically connected to the second electrode, wherein the second power supply line comprises a first portion and a second portion, the first portion surrounding the second boundary, the third boundary and the fourth boundary of the display area, and the second portion being on a side of the first power bus away from the display area;
  wherein there is a gap between the first power bus and the second portion of the second power supply line, and an orthographic projection of the gap on the base substrate at least partially overlaps with an orthographic projection of the second electrode on the base substrate;
  a plurality of touch electrode lines in the peripheral area, wherein orthographic projections of the plurality of touch electrode lines on the base substrate at least partially overlap with the orthographic projection of the gap on the base substrate; and
  a protective layer covering the second power supply line, wherein at least a part of the protective layer is between the second power supply line and the second electrode, the at least a part of the protective layer is directly covered by a part of the second electrode in the peripheral area, the at least a part of the protective layer directly covers the second power supply line, and hydrophilicity of the protective layer is less than hydrophilicity of the second power supply line.

2. The display substrate according to claim 1, wherein the second portion comprises a first sub-portion and a second sub-portion spaced apart from and opposite to the first sub-portion; and
  there is a first gap between the first sub-portion and the first power bus, there is a second gap between the second sub-portion and the first power bus, and an orthographic projection of at least one of the first gap or the second gap on the base substrate at least partially overlaps with the orthographic projection of the second electrode on the base substrate.

3. The display substrate according to claim 2, wherein the first sub-portion is close to the second boundary, and the second sub-portion is close to the fourth boundary.

4. The display substrate according to claim 2, wherein orthographic projections of the first gap and the second gap on the base substrate are inside the orthographic projection of the second electrode on the base substrate.

5. The display substrate according to claim 1, wherein:
  the plurality of touch electrode lines comprise a plurality of first touch electrode lines and a plurality of second touch electrode lines, the plurality of first touch electrode lines surrounding the second boundary, the third boundary and a part of the first boundary of the display area, and the plurality of second touch electrode lines surrounding the fourth boundary and another part of the first boundary of the display area.

6. The display substrate according to claim 5, wherein the plurality of first touch electrode lines are signal transmission lines, and the plurality of second touch electrode lines are signal receiving lines.

7. The display substrate according to claim 1, further comprising:
  a flexible circuit board electrically connected to the plurality of touch electrode lines, the first power bus and the second power supply line and configured to provide electrical signals to the plurality of touch electrode lines, the first power bus and the second power supply line.

8. The display substrate according to claim 1, wherein:
  the first power bus is configured to receive a first voltage signal; and the second power supply line is configured to receive a second voltage signal, wherein the first voltage signal is higher than the second voltage signal.

9. The display substrate according to claim 8, wherein the at least one of the plurality of sub-pixels further comprises a thin film transistor and a connection electrode, the thin film transistor comprising an active layer on the base substrate, a gate on a side of the active layer away from the base substrate, and a source and a drain on a side of the gate away from the base substrate, the connection electrode being on a side of the thin film transistor away from the base substrate, the source or the drain being electrically connected to the connection electrode, and the connection electrode being electrically connected to the first electrode.

10. The display substrate according to claim 9, wherein the first power bus comprises a first sub-electrode and a second sub-electrode, wherein an orthographic projection of the first sub-electrode on the base substrate at least partially overlaps with an orthographic projection of the second sub-electrode on the base substrate, the first sub-electrode is in the same layer as the source or the drain, and the second sub-electrode is in the same layer as the connection electrode.

11. The display substrate according to claim 9, wherein the first portion comprises a first conductive portion, a second conductive portion, and a third conductive portion, the second conductive portion being on a side of the first conductive portion away from the base substrate, the third conductive portion being on a side of the second conductive portion away from the base substrate, the first conductive portion, the second conductive portion and the third conductive portion being electrically connected, the first conductive portion being in the same layer as the source or the drain, the second conductive portion being in the same layer as the connection electrode, and the third conductive portion being in the same layer as the first electrode.

12. The display substrate according to claim 11, wherein the second portion comprises a fourth conductive portion, the fourth conductive portion being in the same layer as the source or the drain, and the fourth conductive portion being a structural layer formed integrally with the first conductive portion.

13. The display substrate according to claim 9, further comprising:

a buffer layer on the base substrate;

a first insulating layer on a side of the buffer layer away from the base substrate; and a plurality of first signal lines and a plurality of second signal lines on a side of the first insulating layer away from the base substrate, wherein orthographic projections of the plurality of first signal lines on the base substrate are alternately arranged with orthographic projections of the plurality of second signal lines on the base substrate, the plurality of first signal lines are arranged in different layers from the plurality of second signal lines, and orthographic projections of a part of the plurality of first signal lines and a part of the plurality of second signal lines on the base substrate at least partially overlap with the orthographic projection of the gap on the base substrate.

14. The display substrate according to claim 13, further comprising:

a second insulating layer between the plurality of first signal lines and the plurality of second signal lines; and an interlayer dielectric layer covering the plurality of second signal lines;

wherein the second insulating layer and the interlayer dielectric layer are between the gate and the source or the drain.

15. The display substrate according to claim 14, further comprising:

a capacitor between the interlayer dielectric layer and the base substrate, the capacitor comprising a first capacitor electrode on a side of the first insulating layer away from the base substrate and a second capacitor electrode on a side of the second insulating layer away from the first capacitor electrode, the first capacitor electrode being in the same layer as the gate and being isolated from the gate, and the second capacitor electrode being in the same layer as the plurality of second signal lines.

16. A display device, comprising: the display substrate according to claim 1.

17. The display substrate according to claim 1, further comprising:

a second planarization layer between the first power bus and the second electrode; and a pixel defining layer between the second planarization layer and the second electrode.

18. The display substrate according to claim 17, further comprising:

a first planarization layer between the gap and the second electrode, the first planarization layer covering the protective layer, wherein the second planarization layer, the pixel defining layer, and a part of the protective layer are also between the gap and the second electrode, and the second planarization layer covers the first planarization layer.

* * * * *